United States Patent
Katakwar

(10) Patent No.: US 9,893,726 B1
(45) Date of Patent: Feb. 13, 2018

(54) LOW POWER LEVEL SHIFTER CIRCUIT

(71) Applicant: Apple Inc., Cupertino, CA (US)

(72) Inventor: Mitesh D Katakwar, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/272,801

(22) Filed: Sep. 22, 2016

(51) Int. Cl.
*H03K 19/0175* (2006.01)
*H03K 19/00* (2006.01)
*H03K 19/0185* (2006.01)

(52) U.S. Cl.
CPC . *H03K 19/0013* (2013.01); *H03K 19/018521* (2013.01)

(58) Field of Classification Search
CPC ..... H03K 19/018521; H03K 3/356113; H03K 19/00315; H03K 19/018528
See application file for complete search history.

(56) References Cited

U.S. PATENT DOCUMENTS

| | | | |
|---|---|---|---|
| 7,046,067 | B2 | 5/2006 | Chung |
| 8,184,489 | B2 | 5/2012 | Tanzawa |
| 2004/0061524 | A1 | 4/2004 | Kumar |
| 2011/0273940 | A1* | 11/2011 | Tanzawa ........ H03K 19/01852 326/81 |
| 2014/0097888 | A1* | 4/2014 | Lee ............... H02M 3/155 327/537 |

* cited by examiner

*Primary Examiner* — Long Nguyen
(74) *Attorney, Agent, or Firm* — Meyertons, Hood, Kivlin, Kowert & Goetzel, P.C.; Erik A. Heter

(57) ABSTRACT

A level shifter circuit is disclosed. A level shifter circuit includes a static pull-down circuit that causes an output node to be pulled low responsive to an input circuit receiving a first logic value on an input node. The input node is coupled to receive a signal from circuitry in a first voltage domain, while the output node is configured to provide a corresponding signal into a second voltage domain. The static pull-down circuit is implemented with a passgate having a pair of transistors coupled in series. The level shifter circuit further includes a dynamic pull-up circuit that, when active, causes the output node to be pulled high responsive to the input circuit receiving a second logic value on the input node. The dynamic pull-up circuit includes third and fourth transistors coupled in series between the output node and a supply voltage node of the second voltage domain.

19 Claims, 7 Drawing Sheets

LOW POWER LEVEL SHIFTER CIRCUIT

BACKGROUND

Technical Field

This invention relates to electronic systems and integrated circuits having multiple voltage domains, and more particularly, to level shifting circuits used to convey signals from one voltage domain to another voltage domain.

Description of the Related Art

Many integrated circuits and electronic system include multiple voltage domains, i.e. multiple portions that operate according to different supply voltages. Furthermore, within a given voltage domain, the supply voltage may be adjusted during operation for various reasons (e.g., power savings, performance boosting, etc.). Thus, the operating voltages in different domains may be different relative to one another. Despite these difference, signals carrying information may be conveyed between functional circuit blocks in different voltage domains.

In order to convey signals from one voltage domain to another, level shifter circuits may be used. A level shifter circuit is one that receives two different supply voltages, one from the domain of the incoming signal and one from the domain of the outgoing signal. The level shifter may thus receive signals having a voltage swing in accordance with a first supply voltage and may output corresponding signals having a voltage swing in accordance with a second supply voltage. In some implementations, the voltage domain into which the outgoing signal is transmitted may operate at a voltage greater than that from which the incoming signal is received. In other implementations, the voltage domain into which the outgoing signal is transmitted may operate at a voltage that is less than that from which the incoming signal is received.

SUMMARY

A level shifter circuit is disclosed. In one embodiment, a level shifter circuit includes a static pull-down circuit that, when active, causes an output node to be pulled low responsive to an input circuit receiving a first logic value on an input node. The input node is coupled to receive a signal from circuitry in a first voltage domain, while the output node is configured to provide a corresponding signal into a second voltage domain. The static pull-down circuit may be implemented with a passgate having a pair of transistors coupled together in series. The level shifter circuit further includes a dynamic pull-up circuit that, when active, causes the output node to be pulled high responsive to the input circuit receiving a second logic value on the input node. The dynamic pull-up circuit includes third and fourth transistors coupled in series between the output node and a supply voltage node of the second voltage domain.

In one embodiment, gate terminals of each of the transistors of the static pull-down circuit are coupled to a respective fixed voltage node. A gate terminal of the first transistor is coupled to a supply voltage node of the first (input) voltage domain, while a gate terminal of the second transistor is coupled to a supply voltage node of the second (output) voltage domain. The level shifter may also include an input circuit implemented using a pair of series-coupled inverters. The pull-down path may be completed by a transistor of an inverter coupled to the static pull-down circuit.

The dynamic pull-up circuit may include a transistor arranged to cause activation of one of the transistors implemented therein responsive to the input circuit receiving the second logic value on the input node. Additional transistors may also be included to inhibit activation of the transistor when the first logic value is received on the input node. Another transistor in the dynamic pull-up circuit includes a gate terminal coupled to receive an enable signal. When active, the enable signal activates this transistor and couples the dynamic pull-up circuit to the second supply voltage node. When the enable signal is inactive, this transistor may prevent other devices in the dynamic pull-up circuit from receiving the second supply voltage.

A communications link is also disclosed. In one embodiment, the communications link includes a transmitter coupled to receive signals from a functional circuit block in a first voltage domain and configured to transmit signals across the link in a second voltage domain. The transmitter includes a level shifter circuit configured to level shift incoming signals from the first voltage domain to the second voltage domain. The communications link further includes a receiver circuit. The receiver circuit may receive signals transmitted across the link in the second voltage domain. The receiver may include another level shifter circuit that outputs signals in a voltage domain different from the second (e.g., back into the first voltage domain, or into a third voltage domain different from the first and second).

BRIEF DESCRIPTION OF THE DRAWINGS

The following detailed description makes reference to the accompanying drawings, which are now briefly described.

Figure 1:
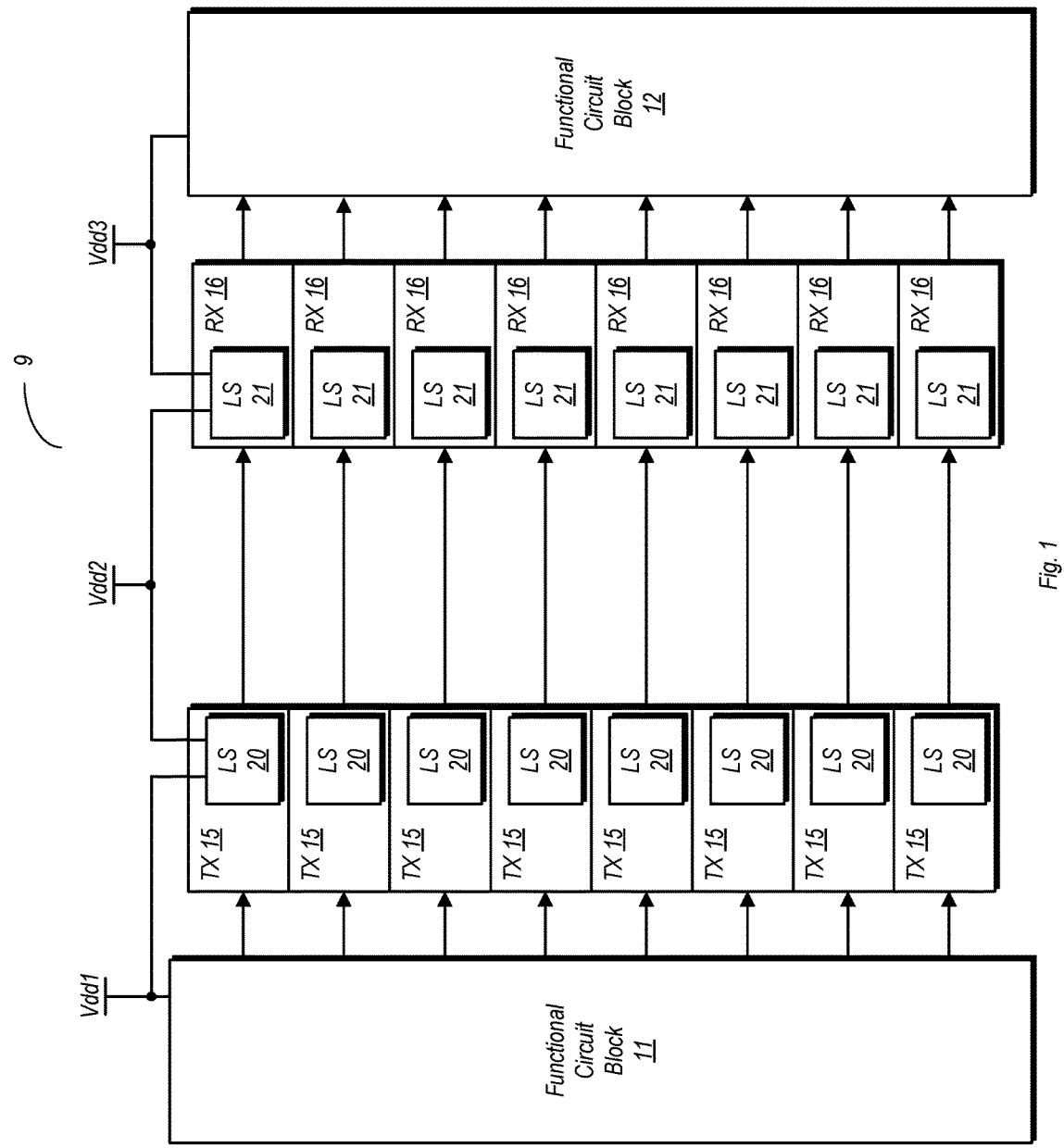
FIG. 1 is a block diagram of one embodiment of a system having a communications link implemented in different voltage domains.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something; physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an exemplary system. System 9 is shown here for the sake of illustration, and is not intended to limit the disclosure to any specific arrangement or configuration. System 9 may be implemented entirely on a single integrated circuit in some embodiments, or across multiple integrated circuits in other embodiments. Embodiments are also possible and contemplated wherein the various elements of system 9 are implemented on separate printed circuit boards, separate cabinets, or remotely with respect to one another.

In the embodiment shown, system 9 includes functional circuit blocks 11 and 12. Each of these functional circuit blocks may perform various functions for the system in which they are implemented. Examples of functional circuit blocks 11 and 12 include general purpose processors, graphics processors, memory, memory controllers, input/output (I/O) units, and so forth. Various types of circuitry within each of functional circuit blocks 11 and 12 may include analog, digital, and/or mixed signal circuits.

Functional circuit block 11 is coupled to convey data to functional circuit block 12 in the embodiments shown over a communications link. In this particular example, the communications link is eight bits wide, although links of any width, including single-bit serial links, are possible and contemplated. For each bit of the link, a transmitter 15 and a receiver 16 is implemented.

Functional circuit block 11 in the embodiment shown is in a first voltage domain, and is coupled to receive a supply voltage via supply voltage node Vdd1 (it is noted that the term "power domain" may also be used interchangeably with voltage domain). Signals are transmitted across the communications link in a second voltage domain coupled to receive a supply voltage via supply voltage node Vdd2. Functional circuit block 12 is coupled to receive a supply voltage via supply voltage node Vdd3. It is noted that in some embodiments, the voltage domains of Vdd1 and Vdd3 may operate according to the same supply voltage source, and may even be consolidated into a single voltage domain. However, since the signals are conveyed across the communications link in a voltage domain different from that from which they originate (functional circuit block 11) or which they are ultimately received (functional circuit block 12), level shifter circuits are implemented for transferring signals from one voltage domain to the next.

In the embodiment shown, each transmitter 15 includes a level shifter 20 that is configured to level shift signals from the voltage domain of Vdd1 to that of Vdd2. Similarly, each receiver 16 includes a level shifter 21 configured to level shift signals from the voltage domain of Vdd2 to that of Vdd3. Various embodiments of these level shifter circuits are discussed in additional detail below.

Figure 2:
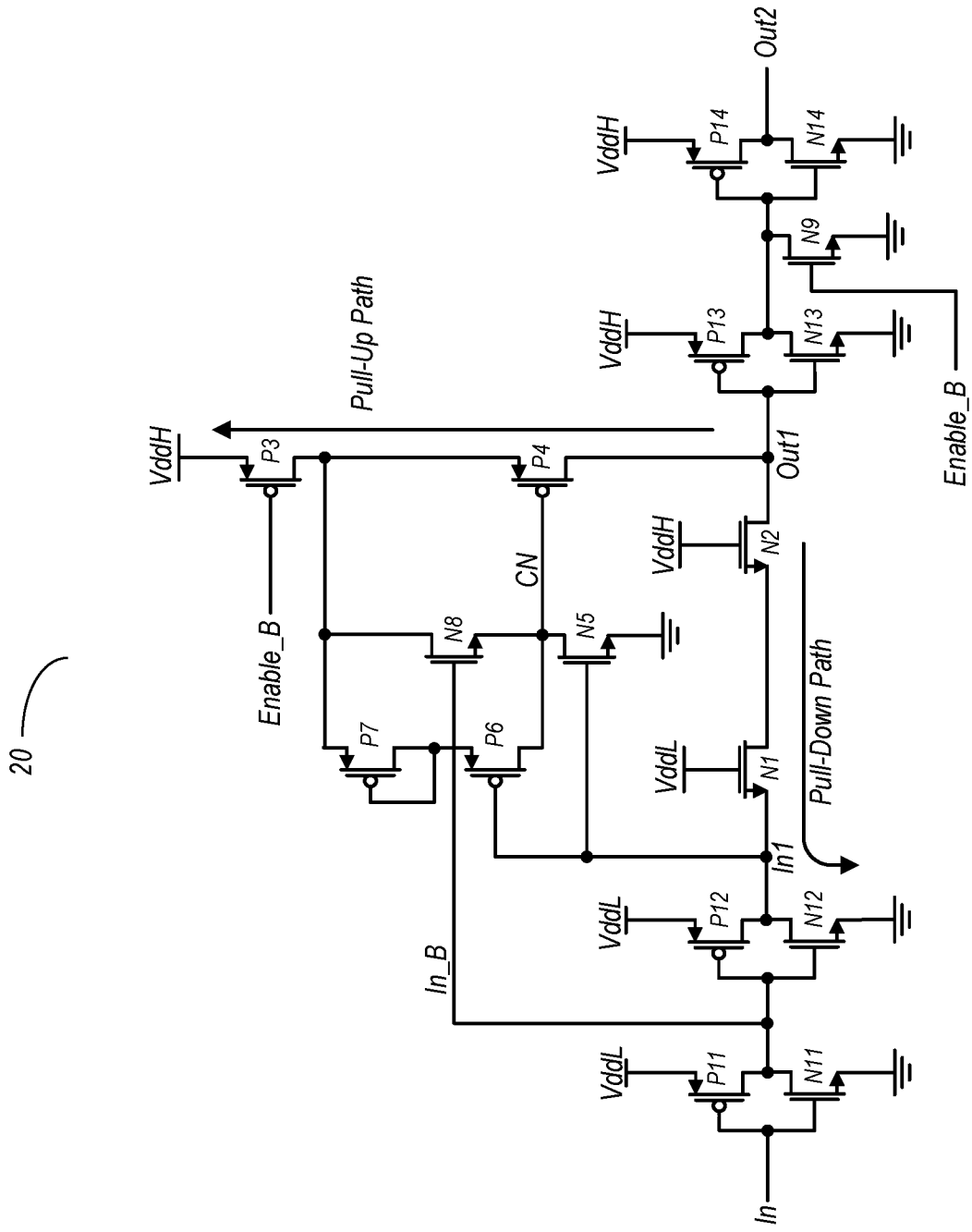
FIG. 2 is a schematic diagram of one embodiment of a level shifter circuit.

Turning now to FIG. 2, a schematic diagram of one embodiment of a level shifter circuit 20 is shown. This particular embodiment may correspond to the level shifter circuit 20 of the transmitters 15 as shown in FIG. 1. It is further noted that this particular embodiment of level shifter circuit 20 is configured to level shift signals up, i.e. from a voltage domain having a supply voltage that is lower on the input side relative to that of the output side.

It is noted here that transistors designated with a 'P' are PMOS transistors, while those designated with an 'N' are NMOS transistors. It is noted however that these designations are not intended to be limiting to all possible embodiments of level shifter circuit 20. In addition to embodiments implemented using CMOS devices, embodiments utilizing other types of devices (e.g., silicone, graphene, etc.) are possible and contemplated.

Lever shifter circuit 20 in the embodiment shown includes a static pull-down circuit and a dynamic pull-up circuit. Operation of level shifter circuit 20 may be enabled via an active low enable signal, Enable_B. This signal is received on the gate terminal of transistor P3. When transistor P3 is active, the various transistors of the dynamic pull-up circuit may receive power. As explained below, transistor P3, when active, may also complete the pull-up path for the dynamic pull-up circuit. When transistor P3 is inactive, various nodes in the dynamic pull-up circuit may be tri-stated, irrespective of any value received on the input node, In.

Signals are input into level shifter circuit 20 from voltage domain VddL through an input circuit that includes a pair of series-coupled inverters. A first of these inverters includes transistors P11 and N11, while a second one of these inverters includes transistors P12 and N12. The first of these inverters is coupled to receive the input signal, via the node 'In', while the second of these inverters is coupled to provide the signal into the level shifter circuit at the same logic value at which it was received, on node 'In1'.

The static pull-down circuit in the embodiment shown includes transistors N1 and N2. These two devices are coupled in series between node In1 and a first output node, Out1. Both of transistors N1 and N2 as shown here include gate terminals coupled to receive a respective fixed voltage. Transistor N1 is coupled to receive the supply voltage present on supply voltage node VddL (the input voltage domain), while transistor N2 is coupled to receive the supply voltage present on VddH (the output voltage domain).

When the input signal received on the input node In is received as a low, the first output node, Out1, is pulled low via the static pull-down circuit. The pull-down path includes transistors N2, N1, and N12, the latter being of the second inverter. When a low is received on the input node, transistor P11 (of the first inverter) is activated, causing the complementary input node, InB, to be pulled high. This in turn causes activation of transistor N12, pulling node 'In1' low. When In1 is pulled low, the gate-source voltage across transistor N1 is sufficient to cause activation of this device. As a result, the junction of the drain of N1 and the source of N2 is also pulled low. Since the gate-source voltage across N2 is now sufficient for activation, it also turns on, and thus the Out1 is pulled low.

The logic low received on the input node may also cause the primary pull-up path through the dynamic pull-up circuit to be inhibited. In the embodiment shown, the primary pull-up path is through transistors P4 and P3. When the received input signal is low, the signal on the complementary input node In_B transitions high, thereby causing activation of transistor N8. When transistor N8 is activated, the critical node CN is pulled high, thereby preventing activation of P4. Additionally, the low in In1 activates transistor P6. Transistor P7, which is a diode-coupled device in this embodiment, activates responsive to the activation of P6. Accordingly, the critical node it pulled high through two different, parallels pull-up paths that prevent activation of P4. Thus, there is no contention between the primary pull-up path and the pull-down path through the static pull-down circuit.

Responsive to receiving a high on the input node In, the dynamic pull-up circuit will activate P4, and thus Out1 is pulled high. The high on the input node In results in a high on In1. The high on In1 is received on the gate terminal of N5, thereby activating this device. When active, N5 provides a pull-down path for the critical node CN. When CN is low, transistor P4 is activated, and thus Out1 is pulled high. The high on In1 also prevents activation of P6, blocking one of the parallel pull-up paths between CN and VddH. The high on In also results in a low on In_B, and thus N8 is also held inactive, blocking the other parallel pull-up path between CN and VddH. The high on In1 resulting from the high on In also causes the gate-source voltage across N1 to be insufficient, and thus this device remains off, blocking the pull-down path.

Level shifter 20 in the illustrated embodiment also includes an output circuit comprising a pair of series-coupled inverters. The first of these inverters includes transistors P13 and N13, and has an input node coupled to Out1. The second of these inverters includes transistors P14 and N14, and has an output node coupled to a second output node, Out2, in the voltage domain of VddH. A clamping transistor is coupled to the node between the first and second inverter, and includes a gate terminal coupled to receive the active low Enable_B signal. When Enable_B is inactive, i.e. high, transistor N9 is activated and thus the input to the second inverter is pulled low. This causes Out2 to be pulled and held high when level shifter 20 is not enabled. This in turn may prevent noise on Out2 that might otherwise occur due to node Out1 floating when P3 is inactive.

Figure 3:
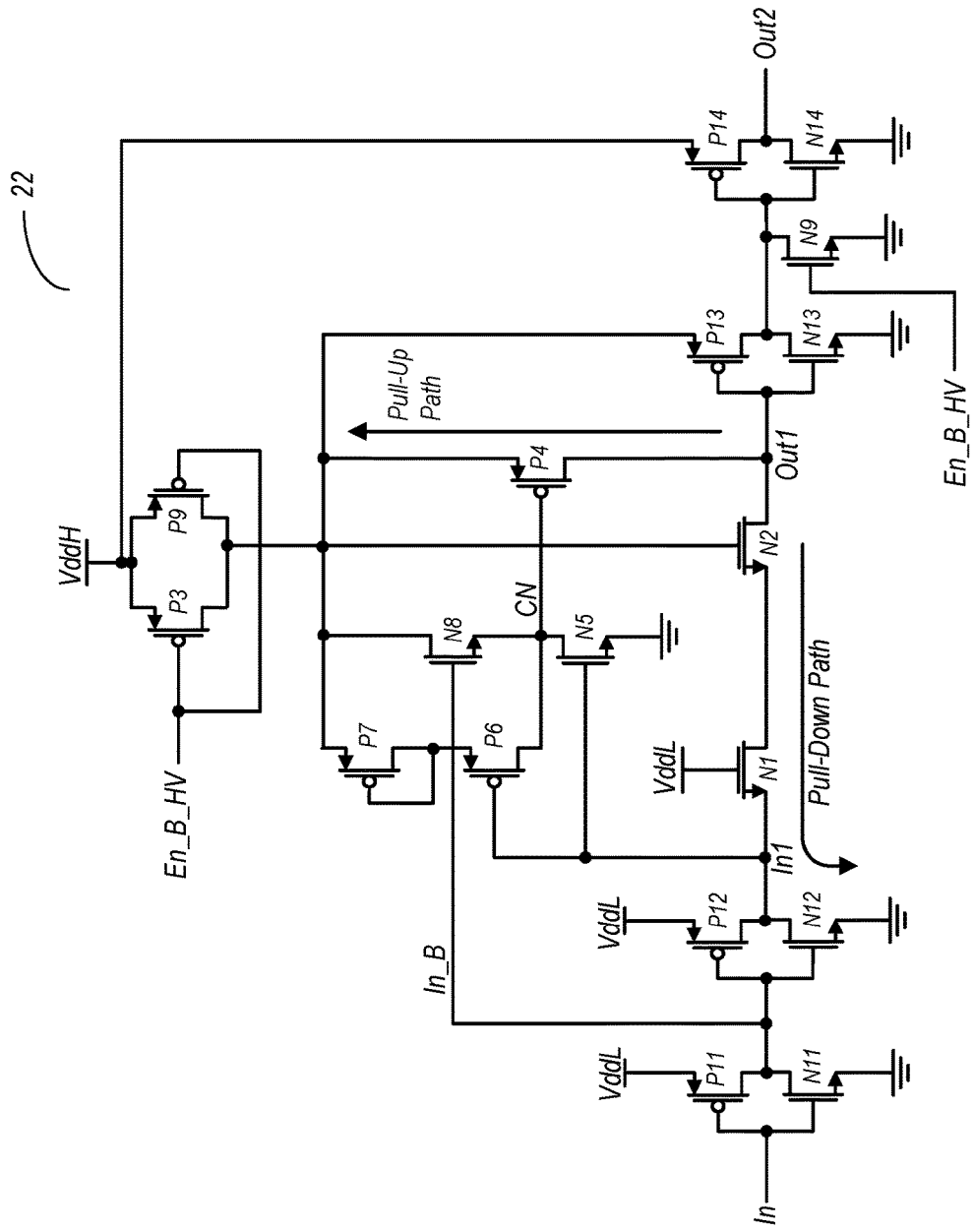
FIG. 3 is a schematic diagram of a second embodiment of a level shifter circuit.

FIG. 3 illustrates another embodiment of a level shifter circuit. In this embodiment, level shifter 22 may replace level shifter 20 in the transmitter circuits 15 shown in FIG. 1. Level shifter 22 operates in substantially the same manner, when enabled, as level shifter 20 of FIG. 2. However, in this embodiment, transistor N2 of level shifter 22 is not hardwired to VddH (or more generally, not hardwired to a fixed voltage). Instead, N2 receives the voltage of VddH on its gate terminal only when P3 and P9 are active. Both P3 and P9 in the illustrated embodiment include respective gate terminals coupled to receive the active low enable signal En_B_HV. When En_B_HV is active, P3 and P9 are on, and the gate terminal of N2 is pulled up toward VddH. Additionally, the other pull-up paths discussed above in reference to level shifter 20 may also be enabled, dependent on the logic value input into the circuit. When En_B_HV is not active (i.e. high in this embodiment), the various pull-up paths of the dynamic pull-up circuit are disabled, with various circuit therein, as well as the gate terminal of N2 being placed in a high impedance state. Clamping transistor N9 is active when En_B_HV is high, and pulling the input to the final inverter of the output circuit low, thus activating P14 and clamping Out2 high.

The level shifter designs of FIGS. 2 and 3 may address a number of problems present in prior art level shifters. Traditional level shifters having a cross-coupled topology may be subject to duty cycle mismatches due to the fact that certain transistors (e.g., the bottom NMOS devices) are controlled by complementary signals, and thus one of these devices has a one inverter delay in switching time relative to the other. This can result in significant duty cycle mismatched across process, voltage, and temperature variations. In the circuits of FIGS. 2 and 3, the pull-up and pull-down paths are based on the logic value at node In1, which may significantly reduce any duty cycle mismatch. This may further enable more reliable operation at higher frequencies. The power gating transistor P3 (as well as P9 in the embodiment of FIG. 3) may reduce power consumption by providing the ability of the pull-up and pull-down circuits to be turned off when not in use. Furthermore, the arrangement of transistors P3 and N5 (and P9 in the embodiment of FIG. 3) do not add insertion delay.

Figure 4:
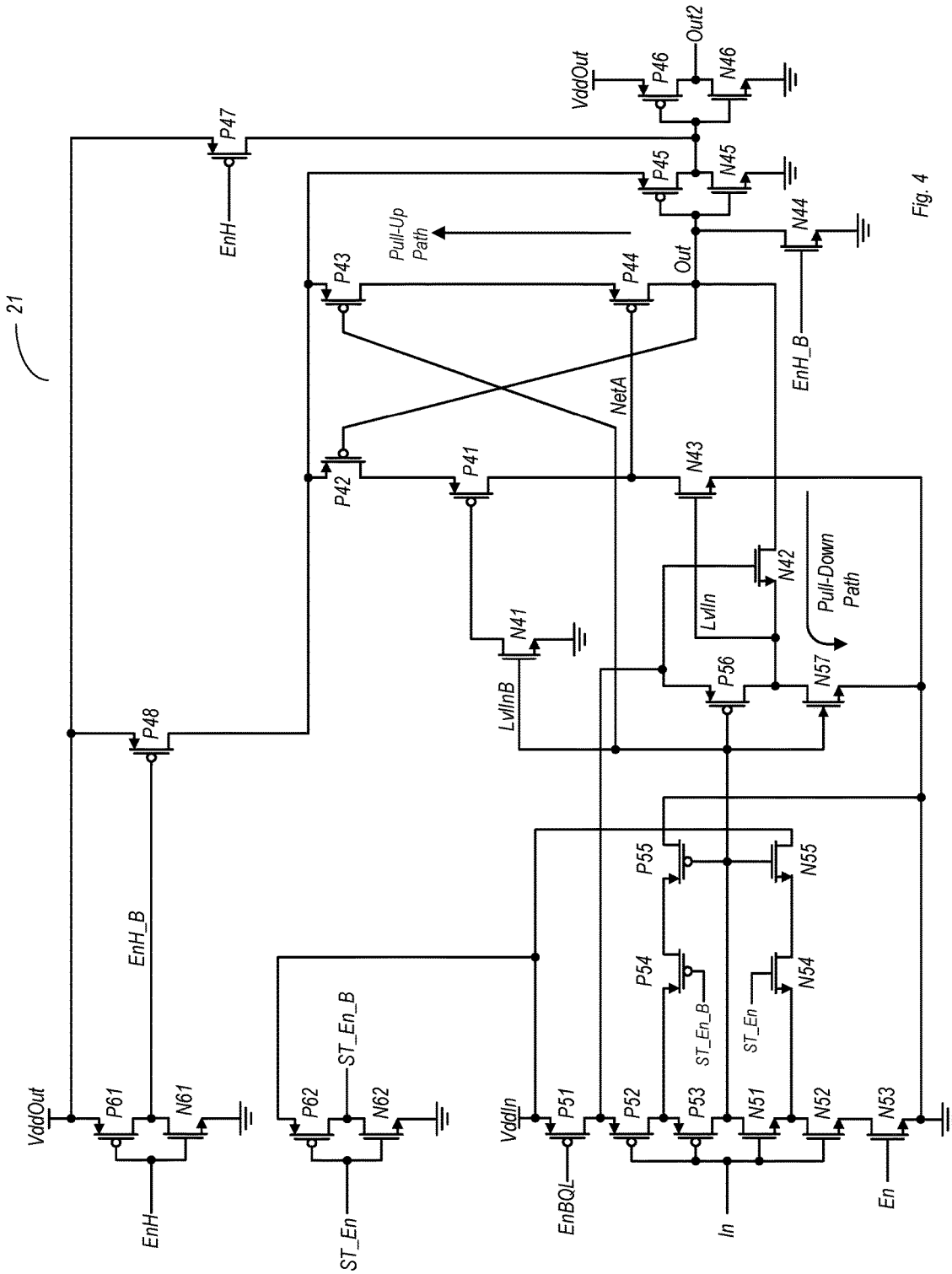
FIG. 4 is a schematic diagram of a third embodiment of a level shifter circuit.

FIG. 4 is a schematic diagram of another embodiment of a level shifter circuit. Level shifter circuit 21 in the embodiment shown may be implemented in receiver 16.

In the embodiment shown, level shifter circuit 21 includes a Schmitt trigger as an input circuit. The Schmitt trigger as shown herein includes the following transistors: P51, P52, P53, P54, P55, N51, N52, N53, N54, and N55. An output from the Schmitt trigger is provided as an input to the inverter implemented with transistor P56 and P57. A pull down path from a first output node, Out, may be provided through transistors N42 and P57. A pull-up path from node Out may be provided through transistor P44, P43, and P48.

The Schmitt trigger in the embodiment shown is coupled to receive four different enabling signals: ST_En, ST_En_B, En, and En_BQL. Enable signal EnBQL is an active low signal that turns on P51, thereby coupling VddIn to various devices in the Schmitt trigger and other transistors that rely in the input voltage, VddIn. Enable signal En is an active high signal that turns on transistor N53. ST_En and ST_En_B are complementary signals provided to the gate terminals of N54 and P54, respectively. ST_En is an active high signal, while ST_En_B is an active low signal produced by the inverter implemented using transistors P62 and N62.

The output voltage portion of level shifter circuit 21 may be enabled responsive to assertion of another enable signal, EnH, which is active high. When EnH is high, the inverter implemented using transistors P61 and N61 causes EnH_B to be low, thus activating P48. When P48 is active, VddOut is coupled to various transistors on the output side of the circuit.

Level shifter circuit 21 also includes an output circuit having a pair of series-coupled inverters. A first one of these inverters is implemented with transistors P45 and N45. The second of these inverters is implemented with transistors P46 and N46, and provides the final output signal via a second output node, Out2.

When the Schmitt trigger is enabled, a low in the input node In results in a high on node LvlInB. The high on LvlInB activates transistor N55, pulling up the junction between source and drain terminals of transistors N51 and N52, respectively, thus ensuring that N51 remains inactive. Conversely, when a high is received on the input node, the resulting low on LvlInB activates P55 and thus provides a pulldown path from the drain and source terminals of P52 and P53, respectively, ensuring that P53 remains inactive. The Schmitt trigger may operate to remove noise from the incoming signal, and thus may be suited for implementation in a receiver circuit in a communications link, as shown in the exemplary embodiment of FIG. 1.

As noted above, a low on the input node results in a high on node LvlInB. The high on LvlInB causes activation of transistor N57. When N57 is active, the source terminal of N57 is activated, the source terminal of N42 is pulled low. Meanwhile, the gate terminal of N42 is pulled high through P51. Accordingly, the gate-source voltage across N42 is sufficient to activate this device. When N42 is active, the first output node, Out, is pulled low through the pull-down path that includes N42 and N57.

The high on node LvlInB also results in the activation of N41, which pulls the gate terminal of P41 low. When node Out is pulled low, the gate terminal of P42 is also pulled low. Accordingly, NetA will be pulled high through P41, P42, and P48. When NetA is pulled high, P44 is inhibited from activation, blocking the pull-up path from the first output node. The high on LvlInB also inhibits activation of P43.

When a high is received on the input node In, LvlInB, falls low, causing activations of P56. This pulls node LvlIN high, activating transistor N43. The activation of transistor N43 causes NetA to be pulled low, which in turn causes activation of P44. The low on LvlINB also causes activation of P43. Accordingly, the first output node, Out, is pulled high through P44, P43, and P48. A high on Out causes deactivation of P42 thus making sure there is no path between NetA and Vdd_Out.

When idle, level shifter circuit 21 may be tri-stated. The circuits on the input side may be tri-stated by providing EnBQL to P51 in its inactive state (high in this embodiment) as well as providing St_En as a low (its inactive state). This blocks pull-up paths to VddIn. A pull-down path to ground (or Vss) may be blocked by providing the enable signal En in its low, inactive state, to N53.

The pull-up paths to VddOut may be blocked by providing EnH in its inactive low state, thereby causing EnHB to be pulled high. This deactivates transistor P48, blocking pull-up paths for both the first output node, Out, and NetA.

Receiver circuit 21 does include transistors for clamping the output nodes. When EnH_B is high (where EnH_B is the complement of enable signal EnH), transistor N44 is activated. The first output node, Out, is thus pulled low. However, since P45 is prevented from pulling up the intermediate node between the first and second inverters (due to the deactivation of P48) a second clamping transistor, P47, is provided for this purpose. Transistor P47 is configured to activate when the EnH signal is inactive low, pulling up the intermediate node. This causes the second inverter to claim the second output node, Out2, to a logic low value.

Level shifter circuit 21 may provide some of the same advantages that are provided by the various embodiments of level shifters 20 and 21 discussed above. Since the route to the pull-up and pull-down paths originates from node LvlInB, the rise/fall mismatch is minimized, and correspondingly, duty cycle mismatch is also minimized. These circuits may be suitable for high frequency operation, e.g., 1.6 GHz and above. The implementation of the clamping circuits in each level shifter embodiment disclosed herein is independent of the data path, and thus no insertion delay is introduced. Each of the level shifter circuits discussed herein may operate on relatively low input voltages, since the output stages are arranged to toggle as long as the input stages toggle.

Figure 5:
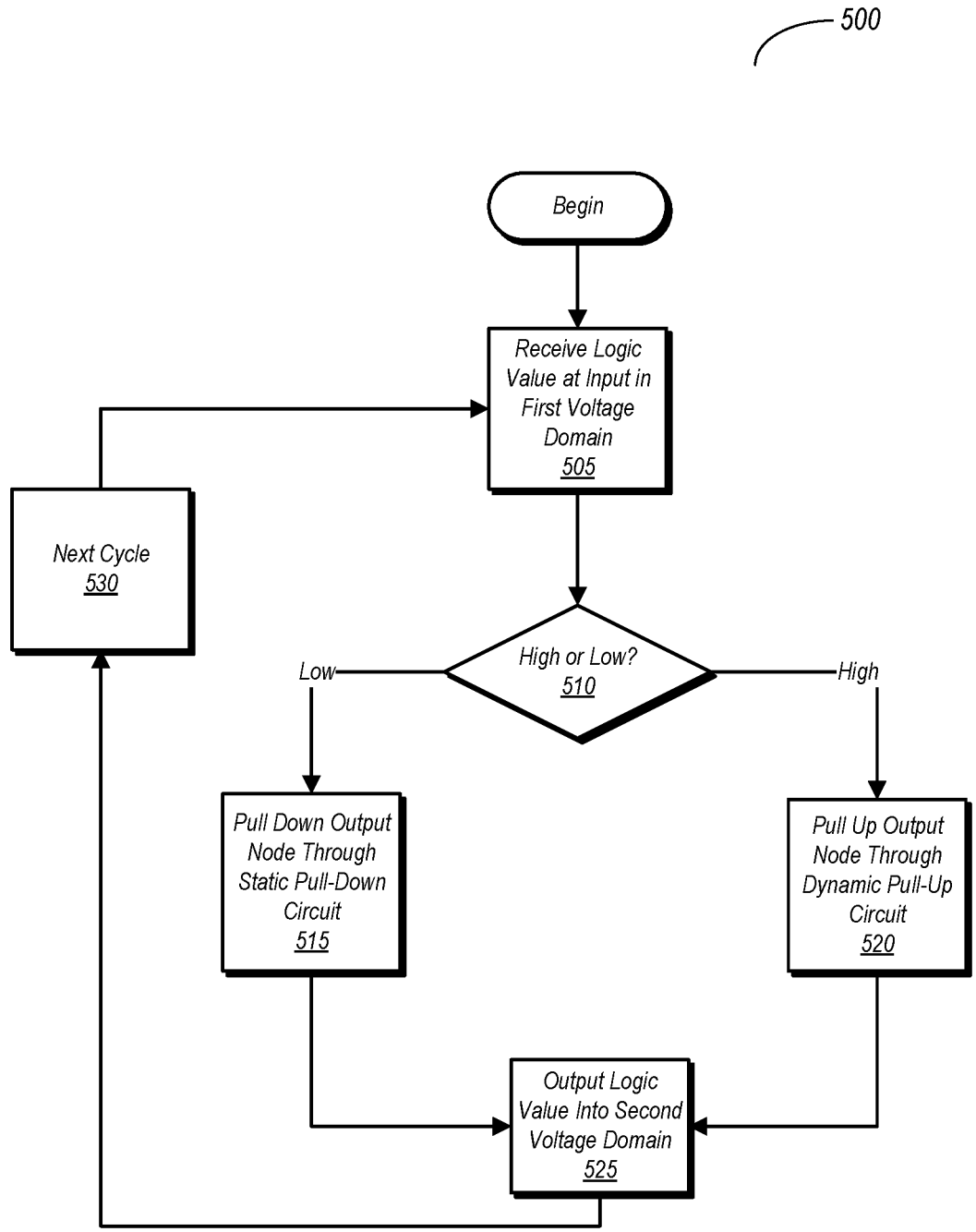
FIG. 5 is a flow diagram illustrating operation of one embodiment of a level shifter circuit.

FIG. 5 is a flow diagram illustrating a method for operating one embodiment of a level shifter circuit. Method 500 may apply to the various level shifter circuits discussed above in reference to FIGS. 2 and 3, and may further apply to other embodiments of a level shifter circuit not explicitly discussed herein. In general, method 500 may apply to any level shifter circuit having a static pull-down circuit and a dynamic pull-up circuit.

Method 500 begins with receiving a signal having a given logic value at an input of a level shifter circuit, from a first voltage domain (block 505). If the received logic value is low (block 510, Low), then an output node is pulled down through a static pull-down circuit (block 515). If the input logic value is high (block 510, high), then the output node is pulled up through a dynamic pull-up circuit (block 520). In either case, the resulting logic value on the output node is output as a signal into the second voltage domain (block 525). The method then proceeds to the next cycle (block 530) and returns to block 505.

Figure 6:
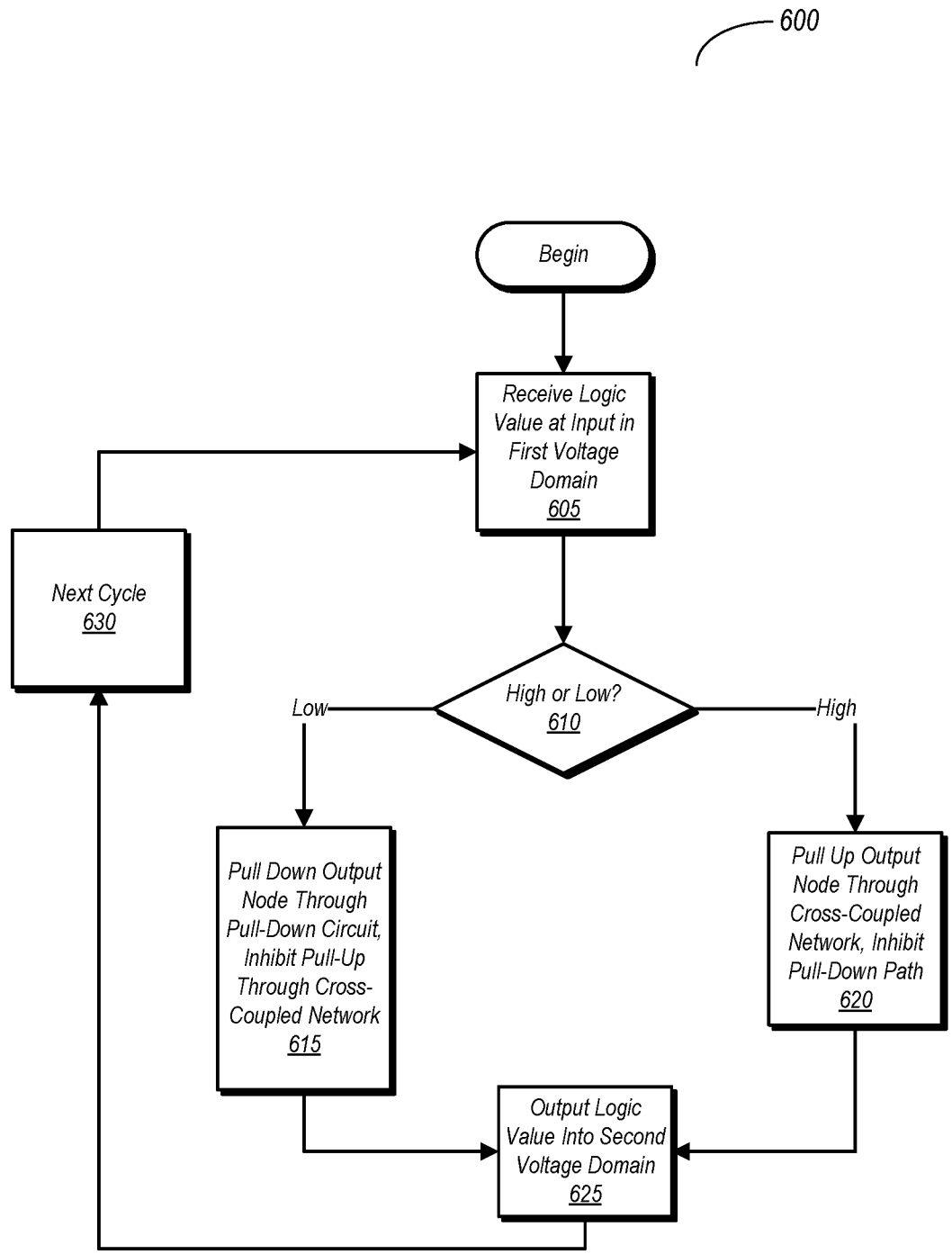
FIG. 6 is a flow diagram illustrating operation of another embodiment of a level shifter circuit.

FIG. 6 a flow diagram illustrating operation of another embodiment of a level shifter circuit. More particularly, method 600 is directed to the operation of level shifter circuit 21 as discussed above. However, method 600 is not limited to the particular disclosed embodiment, but rather, any embodiment that falls within the general scope of level shifter circuit, including other embodiments not explicitly discussed herein.

Method 600 begins with receiving a signal having a given logic value at an input of a level shifter circuit, from a first voltage domain (block 605). If the received logic value is low (block 610, Low), then an output node is pulled down through a pull-down circuit, while a pull-up circuit is inhibited through a cross-coupled network (block 615). If the input logic value is high (block 610, high), then the output node is pulled up through a cross-coupled network, while the pull-down path is inhibited (block 620). After the output node is pulled low or high (depending on what is received on the input node), the resulting output logic value is output into the second voltage domain (block 625). Thereafter, the method proceeds to the next cycle (block 630), returning to block 605.

While the various level shifter circuits have been discussed above in the context of communications links, and more particularly, transmitters and receivers, their application is not limited as such. In contrast, any of the level shifter circuits discussed above, and variations thereof, may be used in any suitable application in which signals cross from one voltage domain to another.

Figure 7:
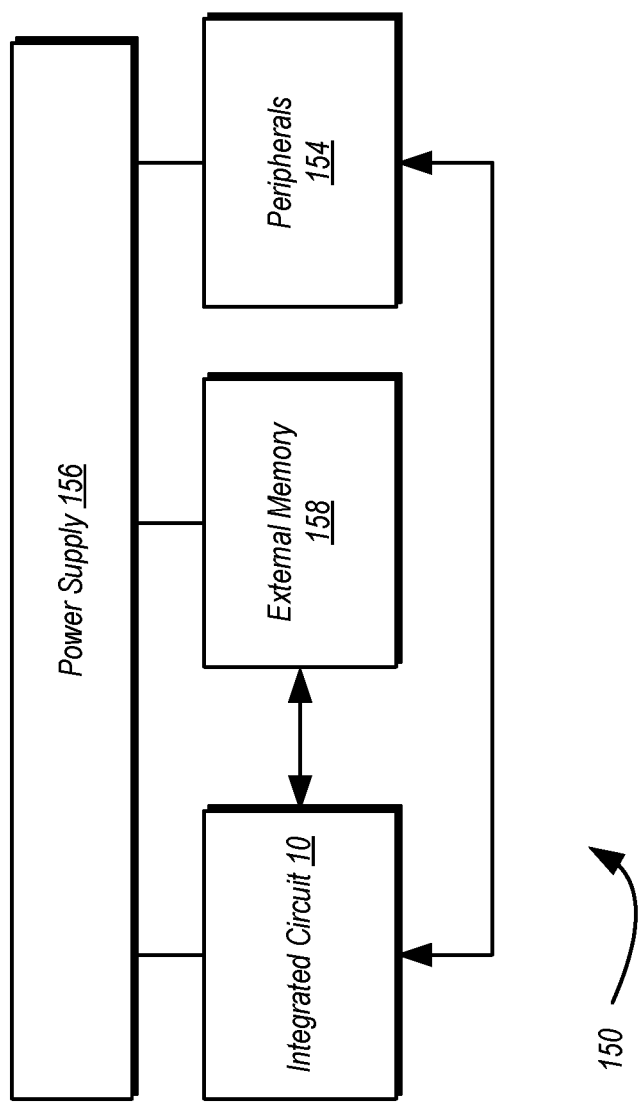
FIG. 7 is a block diagram of one embodiment of an exemplary system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
an input circuit coupled to receive an input signal via an input node in a first voltage domain;
a static pull-down circuit configured to pull down a first output node responsive to the input circuit receiving a first logic value on the input node, the first output node being in a second voltage domain, wherein the static pull-down circuit comprises a passgate having first and second series-coupled transistors, wherein a gate terminal of the first transistor is coupled to a first fixed voltage; and
a dynamic pull-up circuit configured to pull up the first output node based on the input circuit receiving a second logic value on the input node, the dynamic pull-up circuit including a third transistor configured to activate responsive to an enable signal being active on its gate terminal, and a fourth transistor configured to activate responsive to the second logic value on the input node, wherein the third and fourth transistors are coupled in series, and a fifth transistor coupled between a gate terminal of the fourth transistor and a reference voltage node, wherein responsive to the input circuit receiving the second logic value, the fifth transistor is configured to cause activation of the fourth transistor.

2. The circuit as recited in claim 1, wherein the gate terminal of the second transistor is coupled to a second fixed voltage.

3. The circuit as recited in claim 2, wherein a first supply voltage node provides a first supply voltage to circuits in the first voltage domain.

4. The circuit as recited in claim 3, wherein a second supply voltage node provides a second supply voltage to circuits in the second voltage domain.

5. The circuit as recited in claim 3, wherein the third and fourth transistors are coupled in series between the first output node and a second supply voltage node coupled to provide a second supply voltage to circuits in the second voltage domain.

6. The circuit as recited in claim 5, wherein a source terminal of the third transistor is coupled to the second supply voltage node, wherein a drain terminal of the fourth transistor is coupled to the first output node, and wherein a source terminal of the fourth transistor is coupled to a drain terminal of the third transistor.

7. The circuit as recited in claim 1, wherein a drain terminal of the second transistor is coupled to the first output node, wherein a source terminal of the first transistor is coupled to an output of the input circuit, and wherein the drain terminal of the first transistor is coupled to the source terminal of the second transistor.

8. The circuit as recited in claim 1, further comprising sixth and seventh transistors coupled together in series between a gate terminal of the fourth transistor and a drain terminal of the third transistor, wherein the sixth transistor is configured to be activated responsive to the input circuit receiving the first logic value on the input node, wherein the seventh transistor is a diode-coupled transistor configured to activate responsive to activation of the sixth transistor, and wherein the sixth and seventh transistors, when active, are configured to inhibit activation of the fourth transistor.

9. The circuit as recited in claim 8, further comprising an eighth transistor coupled between the gate terminal of the fourth transistor and the drain terminal of the third transistor, wherein the eighth transistor is configured to be activated responsive to the input circuit receiving the first logic value on the input node.

10. The circuit as recited in claim 1, wherein the input circuit includes first and second inverters coupled between the input node and a drain terminal of the first transistor, wherein the second inverter is configured to complete a pull-down path through the static pull-down circuit responsive to the first logic value being received on the input node.

11. The circuit as recited in claim 1, further comprising an output circuit including a pair of series coupled inverters between the first output node and a second output node, wherein the output circuit further includes a pull-down transistor separate from the pair of series-coupled inverters and configured to cause the output circuit to drive the output node to a predetermined state when the enable signal is de-asserted.

12. The circuit as recited in claim 1, wherein the third transistor is configured to disable the dynamic pull-up circuit responsive to the enable signal being inactive on its gate terminal.

13. A method comprising:
receiving, on an input node of an input circuit, a first logic value, wherein the input node is in a first voltage domain;
pulling down a voltage of an output node in a second voltage domain through a static pull-down circuit responsive to the input circuit receiving the first signal at the first logic value, the static pull-down circuit comprising a passgate having first and second series-coupled transistors, wherein the first transistor includes a gate terminal coupled to receive a first supply voltage via a first supply voltage node in the first voltage domain;
receiving, on the input node, a second logic value; and
pulling up the voltage on the output node through a dynamic pull-up circuit responsive to the input circuit receiving the second logic value, the dynamic pull-up circuit including third and fourth transistors coupled in series between the output node and a second supply voltage node in the second voltage domain, wherein the third transistor is configured to activate responsive to receiving an active enable signal on its gate terminal, and wherein the method includes a fifth transistor causing activation of the fourth transistor responsive to the second logic value being received on the input node.

14. The method as recited in claim 13, further comprising providing the second supply voltage to a gate terminal of the second transistor.

15. The method as recited in claim 13, further comprising:
sixth, seventh, and eighth transistors inhibiting activation of the fourth transistor responsive to the first logic value being received on the input node.

16. A system comprising:
first and second functional circuit blocks;
a communications link coupled between the first and second functional circuit blocks, the communications link comprising a transmitter circuit and a receiver circuit, wherein the transmitter circuit is configured to receive signals from a first voltage domain and transmit signals into a second voltage domain, wherein the transmitter includes a first level shifter circuit having a first output node in the second voltage domain, the first level shifter circuit comprising:
an input circuit having an input node in the first voltage domain;
a static pull-down circuit implemented using a passgate, the passgate comprising first and second transistors coupled in series, the first transistor having a gate terminal coupled to a first supply voltage node of the first voltage domain, and wherein the second transistor includes a gate terminal coupled to a second supply voltage node of the second voltage domain, wherein the static pull-down circuit is configured to pull down a voltage on the first output node responsive to the input circuit receiving a first logic value on the input node; and
a dynamic pull-up circuit having third and fourth transistors coupled in series between the first output node and the second supply voltage node, wherein the third transistor is configured to activate responsive to an enable signal being active on its gate terminal and wherein the fourth transistor is configured to activate responsive to the second logic value on the input node, wherein the third and fourth transistors are configured to pull up the first output node responsive to the input circuit receiving a second logic value, and a fifth transistor configured to, responsive to the input circuit receiving the second logic value on the input node, cause activation of the fourth transistor.

17. The system as recited in claim 16, wherein the dynamic pull-up circuit further includes:
a sixth transistors having a drain terminal coupled to a gate terminal of the fourth transistor;
a seventh transistor, wherein the seventh transistor is a diode-coupled transistor having its drain and gate terminals coupled to a source terminal of the sixth transistor, and a source terminal coupled to a drain terminal of the third transistor; and
an eighth transistor having a source terminal coupled to a gate terminal of the fourth transistor and a drain terminal coupled to the drain terminal of the third transistor;
wherein the sixth, seventh, and eighth transistors are configured to inhibit activation of the fourth transistor responsive to the input circuit receiving the first logic value on the input node.

18. The system as recited in claim 16, wherein the input circuit includes first and second series coupled inverters, wherein an output of the second inverter is coupled to the static pull-down circuit and configured to complete a pull-down path through the static pull-down circuit responsive to the first logic value being received on the input node, and wherein the level shifter circuit further includes:
an output circuit comprising third and fourth series coupled inverters coupled between the first output node and a second output node, and wherein the output circuit is configured to drive the second output node to a predetermined state, irrespective of a logic value received on the input node, responsive to de-activation of the enable signal.

19. The system as recited in claim 16, wherein the receiver circuit includes a second level shifter circuit configured to receive signals from the transmitter circuit, in the second voltage domain, and further configured to output signals into a third voltage domain.

\* \* \* \* \*